United States Patent
Shibata et al.

(10) Patent No.: US 7,033,439 B2
(45) Date of Patent: Apr. 25, 2006

(54) APPARATUS FOR FABRICATING A III-V NITRIDE FILM AND A METHOD FOR FABRICATING THE SAME

(75) Inventors: Tomohiko Shibata, Nagoya (JP); Keiichiro Asai, Nagoya (JP); Mitsuhiro Tanaka, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 100 days.

(21) Appl. No.: 09/928,523

(22) Filed: Aug. 13, 2001

(65) Prior Publication Data

US 2002/0028291 A1     Mar. 7, 2002

(30) Foreign Application Priority Data

| Sep. 1, 2000 | (JP) | ............................ 2000-264934 |
| Sep. 27, 2000 | (JP) | ............................ 2000-293596 |
| Jul. 9, 2001 | (JP) | ............................ 2001-207785 |

(51) Int. Cl.
*C30B 25/08* (2006.01)

(52) U.S. Cl. .................. 117/200; 117/202; 117/99; 117/952; 118/715; 118/719

(58) Field of Classification Search .............. 117/200, 117/202, 99, 952; 118/715, 719
See application file for complete search history.

(56) References Cited

U.S. PATENT DOCUMENTS

| 4,382,776 | A | * | 5/1983 | Kawase et al. ............... 432/9 |
| 4,830,982 | A | * | 5/1989 | Dentai et al. ............... 117/104 |
| 5,334,277 | A | * | 8/1994 | Nakamura ................... 117/102 |
| 5,599,732 | A | * | 2/1997 | Razeghi ........................ 117/84 |
| 5,614,249 | A | * | 3/1997 | Mayeda ........................... 427/8 |
| 5,650,361 | A | * | 7/1997 | Radhakrishnan ............ 438/779 |
| 5,728,940 | A | * | 3/1998 | Kim et al. ................... 73/40.7 |
| 6,086,673 | A | * | 7/2000 | Molnar ........................... 117/90 |
| 6,117,213 | A | * | 9/2000 | Ueda et al. .................... 95/273 |
| 6,197,683 | B1 | * | 3/2001 | Kang et al. .................. 438/643 |
| 6,271,104 | B1 | * | 8/2001 | Razeghi et al. ............. 438/481 |
| 6,533,874 | B1 | * | 3/2003 | Vaudo et al. ............... 148/33.5 |
| 6,596,079 | B1 | * | 7/2003 | Vaudo et al. .................. 117/97 |

FOREIGN PATENT DOCUMENTS

| EP | 0 763 610 A1 | 3/1997 |
| EP | 1 127 957 A1 | 8/2001 |
| EP | 1 160 354 A1 | 12/2001 |
| JP | 02034592 A | * | 2/1990 |
| JP | 7-153706 | 6/1995 |

(Continued)

OTHER PUBLICATIONS

Patent Abstracts of Japan. English Abstract of JP 2000-091234. (Mar. 31, 2000).*

(Continued)

*Primary Examiner*—Robert Kunemund
*Assistant Examiner*—Matthew J. Song
(74) *Attorney, Agent, or Firm*—Burr & Brown

(57) ABSTRACT

A hydrogen chloride gas and an ammonia gas are introduced with a carrier gas into a reactor in which a substrate and at least an aluminum metallic material through conduits. Then, the hydrogen gas and the ammonia gas are heated by heaters, and thus, a III–V nitride film including at least Al element is epitaxially grown on the substrate by using a Hydride Vapor Phase Epitaxy method.

The whole of the reactor is made of an aluminum nitride material which does not suffer from the corrosion of an aluminum chloride gas generated by the reaction of an aluminum metallic material with a hydrogen chloride gas.

4 Claims, 4 Drawing Sheets

FOREIGN PATENT DOCUMENTS

| | | |
|---|---|---|
| JP | 10-067584 | 3/1998 |
| JP | 10-67584 | 3/1998 |
| JP | 11-80961 | 3/1999 |
| JP | 11-080961 | 3/1999 |

OTHER PUBLICATIONS

Schreiber Translations Inc., English Translation of JP 2-34592 (1990) p. 1-16.*

"Powder-Preparation Method," IBM Technical Disclosure Bulletin, IBM Corp., NY, US, vol. 32, No. 9B, Feb. 1, 1990, pp 355-357.

Chani V. I. et al., "Segregation and Uniformity of $K_3Li_2(Ta,NB)_5O_{15}$ Fiber Crystals Grown by Micro-Pulling-Down Method," Journal of Crystal Growth, North-Holland Publishing Co., Amsterdam, NL, vol. 194, No. 3/4, Dec. 1998, pp 374-378.

* cited by examiner

APPARATUS FOR FABRICATING A III-V NITRIDE FILM AND A METHOD FOR FABRICATING THE SAME

BACKGROUND OF THE INVENTION

1. Field of the Invention

This invention relates to an apparatus and a method for epitaxial growth of a III–V nitride film including at least Al element on a substrate by using a Hydride Vapor Phase Epitaxy (HVPE) method.

2. Related Art Statement

In opto-electronic device such as light-emitting diodes and laser diodes, it is proposed that a III–V nitride film having a composition of $Al_xGa_yIn_zN$ ($X+Y+Z=1$) including at least Al element is epitaxially grown on a given substrate. For example, it is described in "J. Appl. Phys., 68, No. 7 (1999)", from pp774 onward that a GaN film is epitaxially grown on a sapphire substrate.

In this method, a Ga metallic material is charged into a reactor in which a sapphire substrate having a GaN film on its surface is held, and a hydrochloric gas is also introduced into the reactor to generate a gallium chloride gas. Then, the gallium chloride gas and an ammonia gas are reacted with each other to deposit the GaN film on the sapphire substrate. This forming process is generally called as a "Hydride Vapor Phase Epitaxy (HVPE) method".

The HVPE method is characterized by having a larger growth rate than that of a conventional Metalorganic vapor Phase Epitaxy (MOVPE) method. For example, if the GaN film is epitaxially grown by the MOVPE method, the typical growth rate is several μm/hour. On the other hand, if the GaN film is epitaxially grown by the HVPE method, the typical growth rate is several ten-hundred μm/hour. Therefore, the HVPE method has a special advantage in fabricating a III–V nitride film having a larger thickness.

In the case of fabricating an AlN film using the above HVPE method, an aluminum metallic material and a chloride based gas are charged into a reactor to generate an aluminum chloride gas in the reactor. Then, the aluminum chloride gas and an ammonia gas are reacted with each other in the reactor to deposit the AlN film on a given substrate.

It is confirmed, however, that the AlN film with good and stable properties cannot be fabricated using the above conventional HVPE method. Therefore, the inventors of the present invention have intensely studied the causes of the deterioration in the AlN film fabricated by the conventional HVPE method, and discovered the following.

A reactor employed in the conventional HVPE method is made of silicon oxide-based material such as quartz. However, the silicon oxide-based material is likely to be corroded by an aluminum chloride gas generated through the reaction of an aluminum metallic material and a chloride-based gas to form pinholes in the reactor. As a result, air is introduced into the reactor from the outer environment of the reactor, and oxygen elements are taken into the AlN film fabricated or being fabricated to deteriorate the crystallinity of the AlN film. Such a poor crystallinity AlN film can not be used for an opto-electronic device substrate.

Moreover, if the pinholes are formed in the reactor through the corrosion of the AlCl gas, various gases are leaked from the reactor to the outside to bring pollution to the outer environment, in addition to the problem that the surrounding air is introduced into the reactor.

In order to iron out the corrosion of the reactor by the AlCl gas, it is suggested that the reactor is made of a BN material or a $SiN_x$ material having large anti-corrosion property against the AlCl gas. However, such an anti-corrosion material shows only poor processing performance, and thus, can not be employed practically. Moreover, the anti-corrosion material is expensive, resulting in the higher cost of the A&N film.

The above problems due to the conventional HVPE method exist in fabricating a $Al_xGa_yIn_zN$ ($X+Y+Z=1$), in addition to the above AlN film.

SUMMARY OF THE INVENTION

It is an object of the present invention to work out the above problems, and thus, to provide an apparatus and a method using the HVPE method for fabricating a III–V nitride film including at least Al element having good properties through the removal or the mitigation of the AlCl corrosion.

In order to achieve the above object, this invention relates to an apparatus for fabricating a III–V nitride film that includes at least Al element (a first fabricating apparatus) comprising a reactor of which at least the part to be contacted with aluminum chloride gas is made of an aluminum nitride material, wherein as viewed from a gas flow direction, at least an aluminum metallic material is charged into the upstream side of the reactor and a substrate is set into the downstream side of the reactor, and then, a III–V nitride film including at least Al element is epitaxially grown by using a Hydride Vapor Phase Epitaxy method through the reaction between the aluminum chloride gas generated by the reaction of the aluminum metallic material with the chloride-based gas and the ammonia gas which are introduced from the outside with a carrier gas.

Herein, the wording "reactor" means a sealed or a semi-sealed reactor enclosed by given walls, in addition, nozzle parts to be used in the reactor and reactor parts such as a current plate.

Moreover, this invention relates to an apparatus for fabricating a III–V nitride film including at least Al element on a given substrate by using a Hydride Vapor Phase Epitaxy method (a second fabricating apparatus), comprising a double structure reactor constructed of an inner reactor to hold a substrate and at least an aluminum metallic material therein and an outer reactor surrounding the inner reactor which are made of a silicon oxide-based material, a gas-supplying means to introduce a chloride-based gas, an ammonia gas and a carrier gas into the inner reactor, a heater to heat the interior of the inner reactor, and a gas leak-detecting means with a gas concentration sensor to detect the gas leak in between the inner reactor and the outer reactor.

In the first fabricating apparatus, the whole of the reactor may be made of aluminum nitride material in fabricating a III–V nitride film including at least Al element. Moreover, the reactor body may be made of silicon oxide and an AlN film may be coated on the inner surface of the reactor body to complete the reactor to be used in the present invention. In both cases, the reactor is not corroded by the AlCl gas. In the former case, the AlN film can be fabricated by a thermal CVD method. Therefore, the reactor body can be coated by the AlN film without corrosion.

Moreover, in the first fabricating apparatus, the part of the reactor to be contacted with the AlCl gas may be made of aluminum nitride material, and the rest may be made of silicon oxide-based material to complete a hybrid reactor made of the aluminum nitride and the silicon oxide material. In this case, the thus obtained hybrid reactor is partially made of the silicon oxide-based material to be easily processed, and thus, the fabricating cost of the reactor can be decreased.

In the second fabricating apparatus, the pressure difference can be generated in between the inner reactor and the outer reactor so as to detect, with a gas concentration sensor, the concentration of a given gas in either one under a lower pressure atmosphere. In this case, it is preferable that the pressure inside the outer reactor is set to be lower than that of the inner reactor and thus, the gas concentration of a given gas in the outer reactor is detected with the gas concentration sensor.

Preferably, the gas concentration sensor is used to detect the gas concentration of at least one selected from the group consisting of ammonia gas, hydrogen chloride gas, nitrogen gas, inert gas and oxygen gas. Since the ammonia gas, the hydrogen chloride gas, the inert gas and the nitrogen gas are used in epitaxial growth according to the present invention, the gas concentration sensor can be positioned so as to detect the leak gas composed of the at least one of the above-mentioned ammonia gas etc., from the inner reactor to the outer reactor.

Moreover, the oxygen gas is incorporated in the environmental atmosphere around the reactor, so the gas concentration sensor can be positioned so as to detect the oxygen gas concentration.

As mentioned above, in the second fabricating apparatus, the leak gas of the inner reactor through the outer reactor is detected with the gas concentration sensor, not a simple gas sensor. The reason is that it is important to detect the degree of the gas leak because a small degree of gas leak is allowable in fabricating a III–V nitride film.

Therefore, the occurrence of the gas leak not allowable is judged when the leak gas concentration is beyond a given threshold value. In this case, the corroded inner reactor by the AlCl gas is exchanged for a new one.

According to the above first fabricating apparatus and the second fabricating apparatus, the III–V nitride film can be epitaxially grown on a given substrate at a high growth rate with the removal or the mitigation of the AlCl gas corrosion, so that the properties of the III–V nitride film can be developed.

Also, this invention relates to a fabricating method using the second fabricating apparatus, concretely to a method for fabricating a III–V nitride film, comprising the steps of:

preparing a double structure reactor constructed of an inner reactor and an outer reactor, capable of detecting a gas leak in between the inner reactor and the outer reactor, charging at least an aluminum metallic material in the upstream side of the inner reactor and setting a given substrate in the down stream, as viewed from a gas flow direction, introducing a chloride-based gas with a carrier gas into the inner reactor from the outside, to generate an aluminum chloride gas through the reaction of the aluminum metallic material with the chloride-based gas, and introducing an ammonia gas with a carrier gas into the inner reactor from the outside, to epitaxially grow a III–V nitride film including at least Al element on the substrate by using a Hydride Vapor Phase Epitaxy method through the reaction of the aluminum chloride gas with the ammonia gas.

As the above substrate on which the III–V nitride film should be grown, a single crystal material of $Al_2O_3$, SiC, $NdGaO_3$, $LiGaO_2$, ZnO, MgO, $MgAl_2O_4$, GaAs, InP or Si may be employed. Moreover, an epitaxial growth substrate constructed of a base material made of the above single crystal material and an underfilm made of a material having a wurtzite crystal structure or a zinc blende crystal structure, e.g., III–V nitride or ZnO may be employed.

The underfilm can be formed by a MOVPE method. In this case of using the MOVPE method, an ELO technique can be used. The underfilm may be constructed of a single layer or multi-layers having the respective different composition.

According to the above fabricating apparatus and the fabricating method, an Al-rich film having Al content of 50 atomic % or over, particularly an AlN film (Al content=100atomic %) can be epitaxially grown by using the HVPE method with the removal or the mitigation of the AlCl gas corrosion.

BRIEF DESCRIPTION OF THE DRAWINGS

For better understanding of the present invention, reference is made to the attached drawings, wherein.

DETAILED DESCRIPTION OF THE INVENTION

Figure 1:
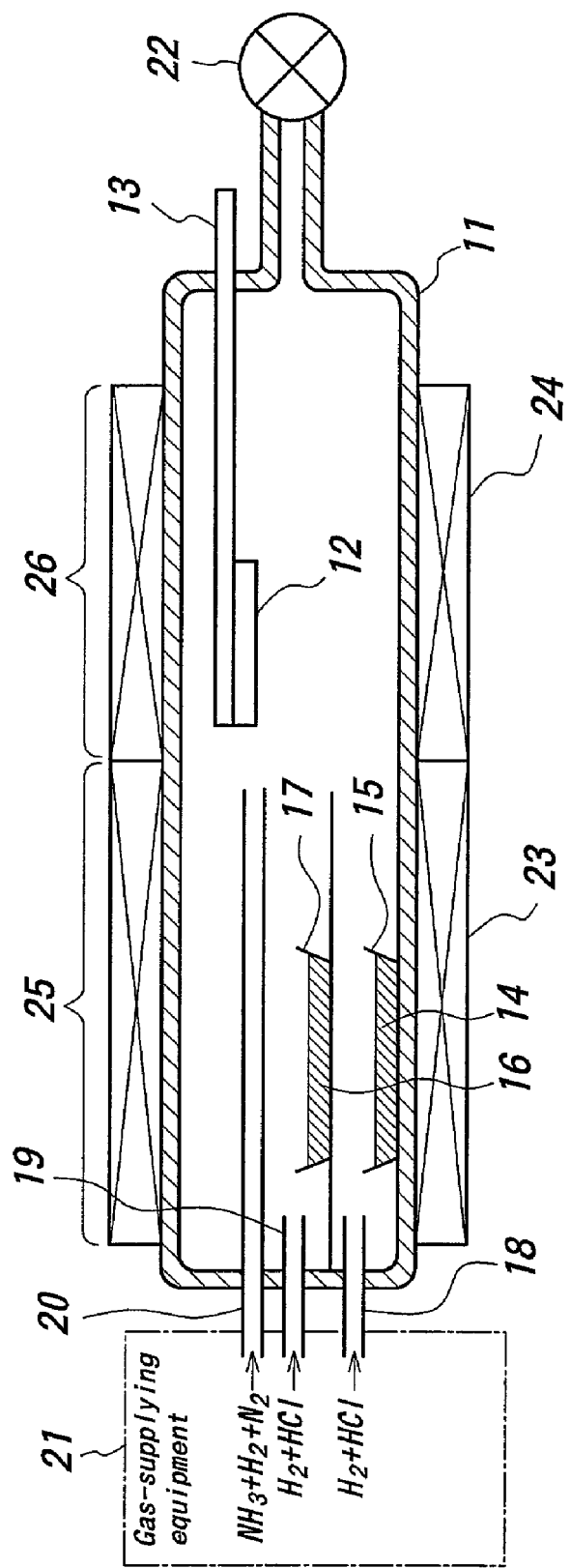
FIG. 1 is a structural view showing a first embodiment of the first fabricating apparatus of the present invention.

FIG. 1 is a structural view showing a first embodiment of the first fabricating apparatus of the present invention. In this embodiment, the whole of the reactor 11 is made of an aluminum nitride material not to be corroded by an AlCl gas. Herein, the wall thickness of the reactor 11 is exaggerated. The aluminum nitride material has a hexagonal or a cubic crystal structure, and may incorporate other elements up to 10% or so as impurities or additives.

Also, in this embodiment, an AlGaN film will be fabricated.

In the reactor 11 are arranged a susceptor 13 to hold a sapphire substrate 12 horizontally, a boat 15 to hold an aluminum metallic material 14 and a boat 17 to hold a gallium metallic material 16. In this embodiment, although the sapphire substrate 12 is held downward, it may be upward.

In this embodiment, a GaN underfilm is formed on the sapphire substrate 12 beforehand to complete an epitaxial growth substrate 12. For the sake of this, the boats 15 and 17 to hold the aluminum metallic material 14 and the gallium metallic material 16 are installed in the reactor 11. In the case of fabricating an AlN film, however, the boat 17 to hold the gallium metallic material 16 can be omitted. In the case of fabricating an AlGaInN film, another boat to hold an indium metallic material is installed.

The GaN underfilm may be fabricated by a MOVPE method. In this case, an ELO technique may be employed. Concretely, a buffer layer grown at a low temperature is formed on the sapphire substrate, and strip $SiO_2$ masks are formed on the buffer layer. Then, the GaN underfilm can be fabricated through ELO growth via the $SiO_2$ masks.

Moreover, in this embodiment, although the boats 15 and 17 to hold the aluminum metallic material and the gallium metallic material are arranged in the same temperature zone, they may be in respective different temperature zones.

In addition, a first conduit 18 to introduce into the reactor 11 H$_2$+HCl gas to be reacted with the aluminum metallic material 14 held by the boat 15, and a second conduit 19 to introduce into the reactor 11 H$_2$+HCl gas to be reacted with the gallium metallic material 16 held by the boat 17 are installed. The H$_2$ gas is a carrier gas, and the HCl gas is a reactive gas to generate AlCl gas with the aluminum metallic material 14 and to generate GaCl gas with the gallium metallic material 16.

An additional, third conduit 20 to introduced into NH$_3$+ H$_2$+N$_2$ gas is installed in the reactor 11. The NH$_3$ gas is reacted with the AlCl gas and the GaCl gas to generate and epitaxilly deposit AlN elements and GaN elements on the sapphire substrate 12, so that the AlGaN film can be epitaxially grown.

The conduits 18–20 are connected with the respective gas sources provided in gas-supplying equipment 21. In this embodiment, if a A-faced or C-faced sapphire substrate is employed, the C axis of the AlGaN film is oriented in a perpendicular direction to the main surface of the sapphire substrate. Such an AlGaN film can be employed for optoelectronic device such as light-emitting diodes and laser diodes. Herein, the orientation of the AlGaN film, that is, the III–V nitride film including at least Al element can be appropriately selected, depending on the crystal surface or the kind of material of the substrate.

Moreover, an evacuation system 22 is communicated with the reactor 11. A first heater 23 is provided in the upstream of the periphery of the reactor 11 as viewed from the gas flow direction, and a second heater 24 is provided in the downstream. The first and second heaters 23 and 24, respectively, can be independently operated, so that the upstream zone temperature and the downstream zone temperature can be independently controlled.

For example, the upstream zone 25 is heated up to 900° C., and the downstream zone 26 is heated up to 1000° C. Accordingly, the upstream zone temperature can be controlled finely. For example, the first and the second boats 15 and 17 are positioned in separation in a gas flow direction, and are heated at different temperatures.

As mentioned above, since the reactor 11 is entirely made of the aluminum nitride not corroded by the AlCl gas generated by the reaction of the aluminum metallic material 14 and the hydrogen chloride gas, no pinholes can be formed in the reactor 11. Therefore, oxygen elements are not entered into the reactor 11, so that a good property AlGaN film can be fabricated on the sapphire substrate 12.

Figure 2:
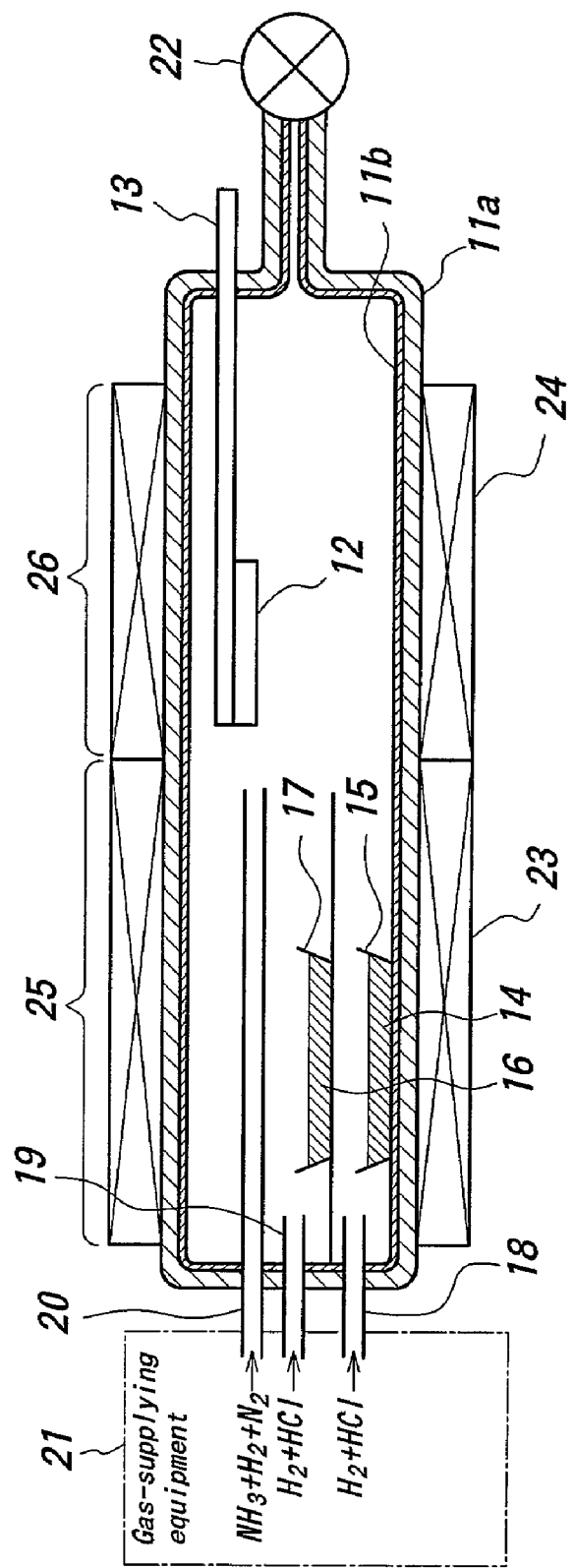
FIG. 2 is a structural view showing a second embodiment of the first fabricating apparatus of the present invention.

FIG. 2 is a structural view showing a second embodiment of the first fabricating apparatus of the present invention. In this embodiment, the same reference numerals are given to the similar parts to the one in the first embodiment as shown in FIG. 1, and a detailed explanation of those reference numerals will be omitted. In the former embodiment, the whole of the reactor 11 is made of an aluminum nitride material not corroded with the AlCl gas. On the other hand, in this embodiment, the reactor 11 is constructed of a reactor body 11*a* made of a quartz material as one of silicon oxide-based material and an aluminum nitride film 11*b*, not corroded with the AlCl gas, coated on the inner surface of the reactor body 11*a*.

The reactor body 11*a* can be easily processed in a desired shape because it is made of the quartz material. The coated aluminum nitride film can be made by a MOVPE method. For example, in this embodiment, the wall thickness of the reactor body 11*a* may be set to about 5 mm, and the thickness of the aluminum nitride film 11*b* may be set to about 20 µm.

Figure 3:
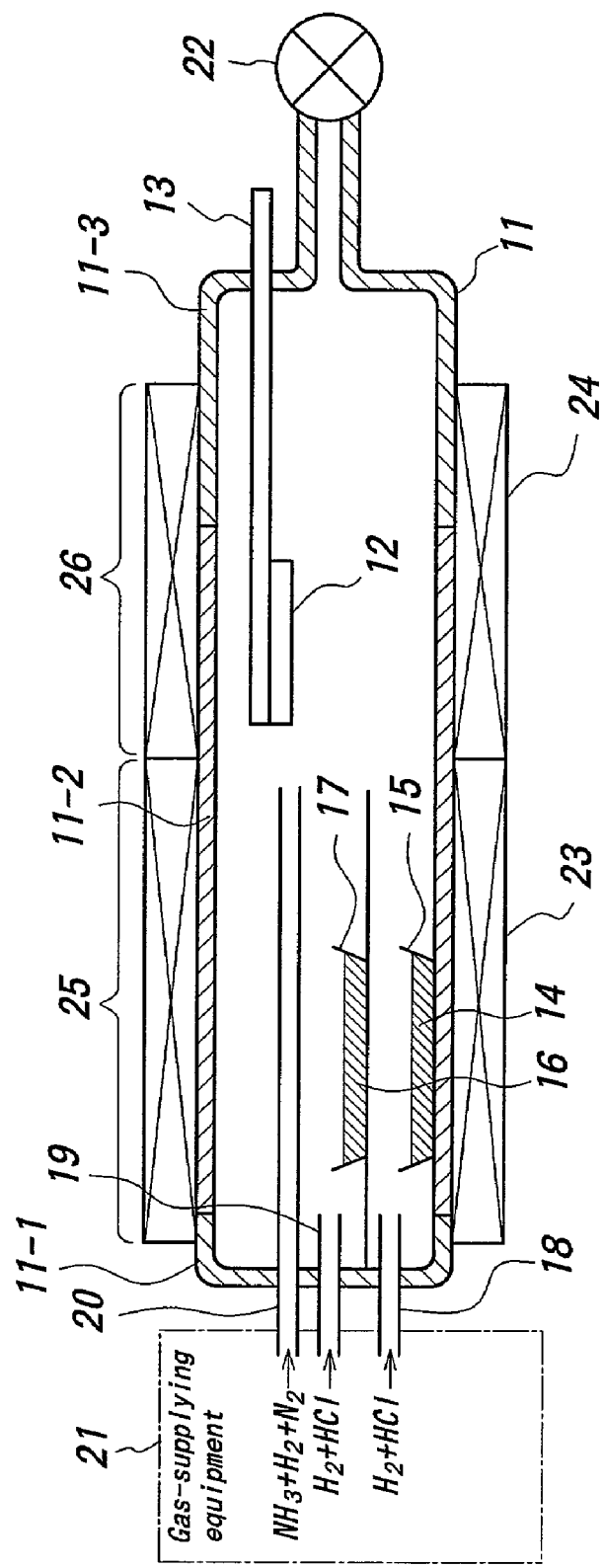
FIG. 3 is a structural view showing a third embodiment of the first fabricating apparatus of the present invention.

FIG. 3 is a structural view showing a third embodiment of the first fabricating apparatus of the present invention. In this embodiment, the same reference numerals are given to the similar parts to the one in the first embodiment as shown in FIG. 1, and a detailed explanation of these reference numerals will be omitted. In this embodiment, the part of the reactor 11 which may be corroded by the AlCl gas is made of an aluminum nitride material, and the rest not corroded is made of a silicon oxide-based material, e.g., a quartz material.

In FIG. 3, the part of the reactor 11 in the inlet side of a gas flow direction is constructed of a first reactor part 11-1 made of a quartz material, and the middle part is constructed of a second reactor part 11-2 made of an aluminum nitride material not corroded by the AlCl gas. Then, the part in the outlet side is constructed of a third reactor part 11-3 made of a quartz material because it is not almost likely to be corroded due to the consumption of the AlCl gas with ammonia gas.

That is, the reactor 11 in this embodiment has a hybrid structure composed of the first and the third reactor parts 11-1 and 11-3 which are made of the quartz materials and the second reactor part 11-2 which is made of the aluminum nitride material. Therefore, the reactor 11 can be easily processed at the first and the third reactor parts 11-1 and 11-3, and thus, the fabricating cost of the whole reactor can be reduced.

Moreover, since the second reactor part 11-2 to be contacted with the AlCl gas is made of the aluminum nitride material, it can not be corroded by the AlCl gas and pinholes are not formed in the reactor 11. As a result, the good property III–V nitride film can be epitaxially grown and the fabricating cost can be reduced due to the life prolongment of the reactor.

Figure 4:
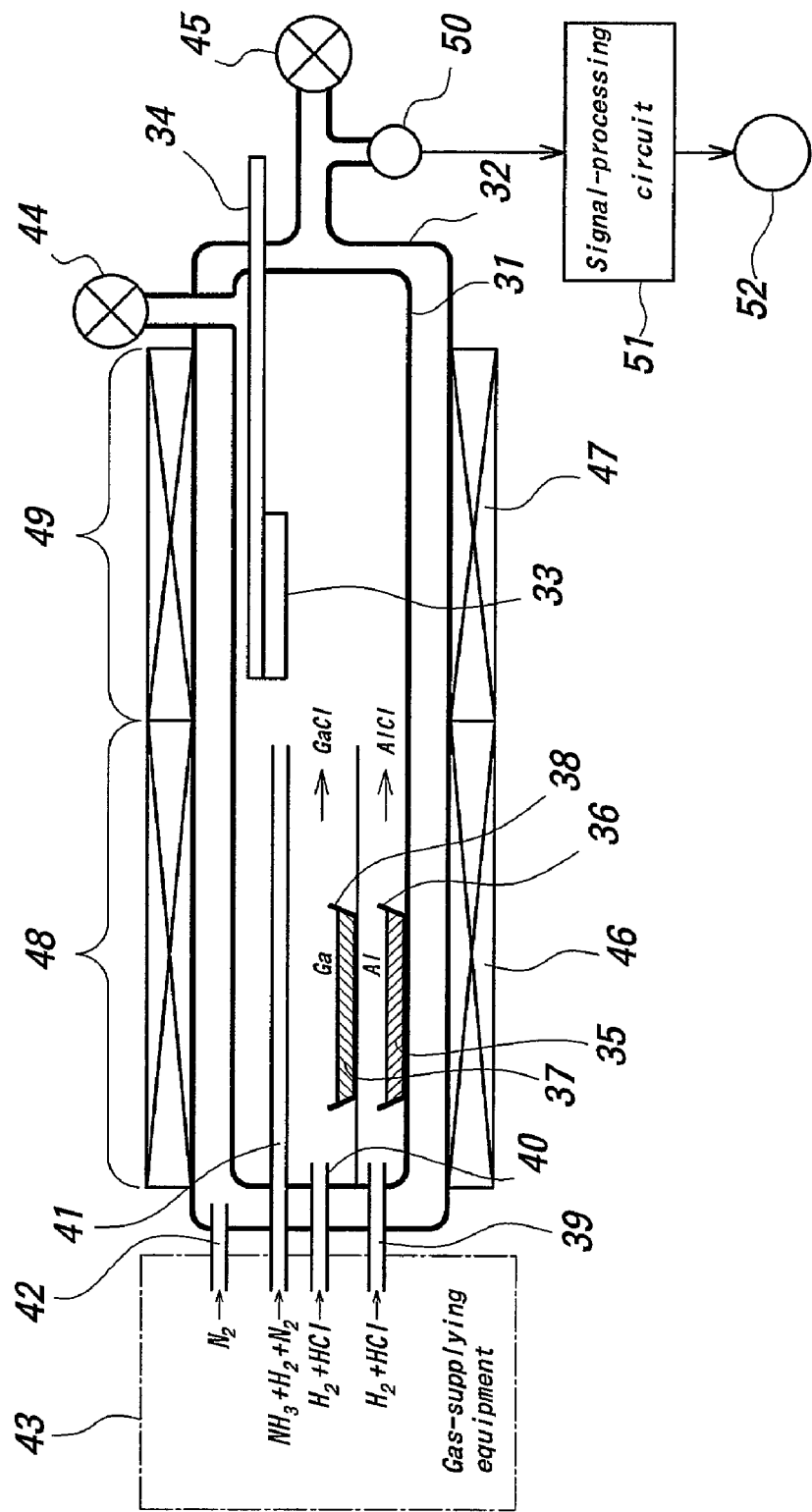
FIG. 4 is a structural view showing an embodiment of the second fabricating apparatus of the present invention.

FIG. 4 is a structural view showing an embodiment of the second fabricating apparatus of the present invention. In this embodiment, a double structure reactor constructed of an inner reactor 31 and an outer reactor 32 is employed. The inner reactor 31 and the outer reactor 32 are made of a quartz material as one of silicon oxide-based material. Moreover, in this embodiment, an AlGaN film will be fabricated.

In the inner reactor 31 are installed a susceptor 34 to hold a sapphire substrate 33 horizontally, a boat 36 to hold an aluminum metallic material 35 and a boat 38 to hold a gallium metallic material 37. In this embodiment, although the sapphire substrate 33 is held downward, it may be upward.

In this embodiment, for the sake of epitaxially growing the AlGaN film on the sapphire substrate 33, the boats 36 and 38 to hold the aluminum metallic material 35 and the gallium metallic material 37 are installed in the inner reactor 31. In the case of fabricating an AlN film, however, the boat 38 to hold the gallium metallic material 37 can be omitted. In the case of fabricating an AlGaInN film, another boat to hold an indium metallic material is installed.

In addition, a first conduit 39 to introduce into the inner reactor 31 H$_2$+HCl gas to be reacted with the aluminum metallic material 35 held by the boat 36, and a second conduit 40 to introduce into the inner reactor 31 H$_2$+HCl gas to be reacted with the gallium metallic material 37 held by the boat 38 are installed. The H$_2$ gas is a carrier gas, and the HCl gas is a reactive gas to generate AlCl gas with the aluminum metallic material 35 and to generate GaCl gas with the gallium metallic material 37.

An additional, third conduit 41 to introduce into the reactor NH$_3$+H$_2$+N$_2$ gas is installed in the inner reactor 31. The NH$_3$ gas is reacted with the AlCl gas and the GaCl gas to generate and epitaxilly deposit AlN elements and GaN elements on the sapphire substrate 33, so that the AlGaN film can be epitaxially grown. On the other hand, $N_2$ gas is introduced through a conduit 42 communicated with the outer reactor 32. The conduits 39–42 are connected with the respective gas sources provided in gas-supplying equipment 43.

In this embodiment, if a A-faced or C-faced sapphire substrate is employed, the C axis of the AlGaN film is oriented in a perpendicular direction to the main surface of the sapphire substrate. Such an AlGaN film can be employed for opto-electronic devices such as, for example, light-emitting diodes and laser diodes. Herein, the orientation of the AlGaN film, that is, the III–V nitride film including at least Al element can be appropriately selected, depending on the crystal surface or the kind of material of the substrate.

Moreover, a first evacuation system 44 is communicated with the inner reactor 31, and a second evacuation system 45 is communicated with the outer reactor 32. A first heater 46 is provided in the upstream of the periphery of the outer reactor 32 as viewed from the gas flow direction, and a second heater 47 is provided in the downstream. The first and second heater 46 and 47 can be independently operated, so that the temperatures of the upstream zone 48 and the downstream zone 49 can be independently controlled.

For example, the upstream zone 48 is heated up to 900° C., and the downstream zone 49 is heated up to 1000° C. Accordingly, the upstream zone temperature can be controlled finely. For example, the first and the second boats 36 and 38 are positioned in separation in a gas flow direction, and are heated at different temperatures.

In this embodiment, a gas concentration sensor 50 is provided in between the inner reactor 31 and the outer reactor 32 as shown in FIG. 4. The gas concentration sensor 50 monitors HCl gas concentration so as to detect the degree of gas leak in between the inner reactor 31 and the outer reactor 32.

In the normal condition of the inner reactor 31, since the HCl gas exists only in the inner reactor 31, the gas concentration sensor 50 does not detect the HCl gas. When pinholes are formed in the inner reactor 31 made of the quartz material through the corrosion of the AlCl gas, the HCl gas is leaked from the inner reactor 31 to the outer reactor 32, so that the gas leak is detected with the gas concentration sensor 50.

In the fabricating apparatus shown in FIG. 4 and a fabricating method using the fabricating apparatus according to the present invention, a determined abnormal condition is judged from the gas concentration beyond a predetermined threshold value, not prominently judged only from the detection of the gas leak.

In this case, the output signal from the gas concentration sensor 50 is normally supplied to a signal-processing circuit 51 to judge the above abnormal condition. The signal-processing circuit 51 judges the abnormal condition when the gas concentration becomes beyond the determined threshold value, and drives an alarm equipment 52. When a user affirms the alarm from the alarm equipment 52, he exchanges the corroded inner reactor 31 for a new one without operating the fabricating process.

Although the present invention was described in detail with reference to the above examples, this invention is not limited to the above disclosure and every kind of variation and modification may be made without departing from the scope of the present invention.

For example, this invention can be also useful for the epitaxial growth using a HVPE method of an $Al_xGa_yIn_zN$ (X+Y+Z=1) including Al element except AlGaN film. Particularly, this invention can be preferably employed for the epitaxial growth of an $Al_xGa_yIn_zN$ including Al content of 50 atomic % or over, more particularly an AlN film.

As the above substrate on which the III–V nitride film should be grown, a single crystal material of $Al_2O_3$, SiC, $NdGaO_3$, $LiGaO_2$, ZnO, MgO, $MgAl_2O_4$, GaAs, InP or Si may be employed. Moreover, an epitaxial growth substrate constructed of a base material made of the above single crystal material and an underfilm made of a material having a wurtzite crystal structure or a zinc blende crystal structure, e.g., III–V nitride or ZnO may be employed.

Moreover, the gas concentration sensor 50 to detect the HCl gas is provided in FIG. 4. However, another gas concentration sensor may be installed so as to detect ammonia gas, nitrogen gas, inert gas. Particularly, a gas concentration sensor to detect oxygen gas may be installed when the surrounding atmosphere is leaked into the inner reactor from the outer reactor. In this case, the interior pressure of the outer reactor can be set to be lower than the atmospheric pressure, and the interior pressure of the inner reactor can be set to be lower than that of the outer reactor.

As mentioned above, an apparatus and a method using a HVPE method for fabricating a III–V nitride film including at least Al element having good properties through the removal or the mitigation of the AlCl corrosion can be provided, according to the present invention.

What is claimed is:

1. An apparatus for fabricating a III–V nitride film including at least Al on a given substrate using a Hydride Vapor Phase Epitaxy method using a chloride-based gas, comprising a double reactor structure constructed of an inner reactor to hold a substrate and at least an aluminum metallic material therein and an outer reactor surrounding the inner reactor comprising a silicon oxide-based material, the inner reactor and the outer reactor being spaced from one another, and an evacuation system in communication with a space between the inner reactor and the outer reactor, a gas-supplying means to introduce chloride-based gas, ammonia gas and carrier gas into the inner reactor, a heater to heat the interior of the inner reactor, and a gas leak-detecting means with a gas concentration sensor to detect gas leaks between the inner reactor and the outer reactor.

2. A fabricating apparatus as defined in claim 1, further comprising means for generating a given pressure difference between the inner reactor and the outer reactor, and means for detecting a given gas concentration in either the inner reactor or the outer reactor which is lower in pressure, said means for detecting said given gas concentration comprising a gas concentration sensor.

3. A fabricating apparatus as defined in claim 2, wherein said means for generating a given pressure sets the interior pressure of the outer reactor to be lower than that of the inner reactor, and said gas concentration sensor is set to detect said given gas concentration in the outer reactor.

4. A fabricating apparatus as defined in any one of claims 1–3, wherein the gas concentration sensor comprises at least one selected from the group consisting of an ammonia gas sensor, a hydrogen chloride gas sensor and an inert gas sensor.

* * * * *